United States Patent
Parthasarathy et al.

(10) Patent No.: US 10,581,423 B1
(45) Date of Patent: Mar. 3, 2020

(54) FAULT TOLERANT LOW LEAKAGE SWITCH

(71) Applicant: Analog Devices Global Unlimited Company, Hamilton (BM)

(72) Inventors: Srivatsan Parthasarathy, Acton, MA (US); Sirui Luo, Carlisle, MA (US); Thomas Paul Kearney, Cork (IE); Yuanzhong Zhou, Andover, MA (US); Donal Bourke, Mallow (IE); Jean-Jacques Hajjar, Lexington, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/238,338

(22) Filed: Jan. 2, 2019

Related U.S. Application Data

(60) Provisional application No. 62/719,282, filed on Aug. 17, 2018.

(51) Int. Cl.
*H01L 27/02* (2006.01)
*H02H 9/00* (2006.01)
(Continued)

(52) U.S. Cl.
CPC . *H03K 17/08104* (2013.01); *H03K 17/04123* (2013.01)

(58) Field of Classification Search
CPC ............... H03K 17/08104; H03K 17/04123
See application file for complete search history.

(56) References Cited

U.S. PATENT DOCUMENTS

| 4,930,036 A | 5/1990 | Sitch |
| 5,751,525 A | 5/1998 | Olney |

(Continued)

FOREIGN PATENT DOCUMENTS

| CN | 103370789 A | 10/2013 |
| CN | 103378587 A | 10/2013 |

(Continued)

OTHER PUBLICATIONS

AND8202/D Application Note, Low-Side Self-Protected MOSFET, ON Semiconductor, Dec. 2016, in 13 pages.
(Continued)

*Primary Examiner* — Kenneth B Wells
(74) *Attorney, Agent, or Firm* — Knobbe, Martens, Olson & Bear, LLP

(57) ABSTRACT

Fault tolerant switches are provided herein. In certain embodiments, a fault tolerant switch includes a switch, a gate driver, and a clamp. The switch includes a switch p-type field effect transistor (PFET) and a switch n-type field effect transistor (NFET) electrically connected in series and controlled by the gate driver. Additionally, the clamp is electrically connected in parallel with the switch, and includes a forward protection circuit including a first diode and a first clamp FET in series, and a reverse protection circuit including a second diode and a second clamp FET in series. The clamp further includes a first gate bias circuit configured to bias a gate of the first clamp FET and a second gate bias circuit configured to bias a gate of the second clamp FET.

20 Claims, 11 Drawing Sheets

(51) Int. Cl.
*H03K 17/081* (2006.01)
*H03K 17/0412* (2006.01)

(56) References Cited

U.S. PATENT DOCUMENTS

| | | | |
|---|---|---|---|
| 5,847,597 A * | 12/1998 | Ooishi | G11O 5/143 327/543 |
| 5,917,689 A * | 6/1999 | English | H01L 27/0259 361/111 |
| 5,946,175 A | 8/1999 | Yu | |
| 6,396,326 B1 | 5/2002 | Chang | |
| 6,404,668 B2 * | 6/2002 | Kowarik | G11C 11/22 365/145 |
| 6,529,359 B1 | 3/2003 | Verhaege et al. | |
| 6,847,511 B2 * | 1/2005 | Ohnakado | H01L 27/0266 361/111 |
| 7,106,562 B2 * | 9/2006 | Kitagawa | H01L 27/0251 361/56 |
| 7,203,045 B2 | 4/2007 | Chatty et al. | |
| 7,285,828 B2 | 10/2007 | Salcedo et al. | |
| 7,405,915 B2 * | 7/2008 | Choi | H01L 27/0285 361/111 |
| 7,566,914 B2 | 7/2009 | Salcedo et al. | |
| 7,601,991 B2 | 10/2009 | Salcedo et al. | |
| 8,044,457 B2 | 10/2011 | Salcedo et al. | |
| 8,194,369 B2 * | 6/2012 | Okushima | H01L 27/0262 361/111 |
| 8,222,698 B2 | 7/2012 | Salcedo et al. | |
| 8,228,651 B2 * | 7/2012 | Kim | H01L 27/0266 361/56 |
| 8,320,091 B2 | 11/2012 | Salcedo et al. | |
| 8,368,116 B2 | 2/2013 | Salcedo et al. | |
| 8,395,869 B2 | 3/2013 | Tsai et al. | |
| 8,416,543 B2 | 4/2013 | Salcedo | |
| 8,422,187 B2 | 4/2013 | Parthasarathy et al. | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,564,065 B2 | 10/2013 | Donovan et al. | |
| 8,592,860 B2 | 11/2013 | Salcedo et al. | |
| 8,610,251 B1 | 12/2013 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,796,729 B2 | 8/2014 | Clarke et al. | |
| 8,860,080 B2 | 10/2014 | Salcedo | |
| 8,946,822 B2 | 2/2015 | Salcedo et al. | |
| 8,947,841 B2 | 2/2015 | Salcedo et al. | |
| 8,958,187 B2 | 2/2015 | Parthasarathy et al. | |
| 9,006,781 B2 | 4/2015 | Salcedo et al. | |
| 9,042,065 B2 | 5/2015 | Van Wijmeersch et al. | |
| 9,088,256 B2 | 7/2015 | Cosgrave et al. | |
| 9,123,540 B2 | 9/2015 | Salcedo et al. | |
| 9,147,677 B2 | 9/2015 | Salcedo et al. | |
| 9,171,832 B2 | 10/2015 | Salcedo et al. | |
| 9,275,991 B2 | 3/2016 | Salcedo et al. | |
| 9,293,912 B2 | 3/2016 | Parthasarathy et al. | |
| 9,461,465 B1 | 10/2016 | Tam et al. | |
| 9,478,608 B2 | 10/2016 | Salcedo et al. | |
| 9,634,482 B2 | 4/2017 | Parthasarathy et al. | |
| 9,729,249 B2 * | 8/2017 | Uemura | H03F 3/082 |
| 9,831,233 B2 | 11/2017 | Salcedo et al. | |
| 9,831,666 B2 | 11/2017 | Parthasarathy et al. | |
| 10,158,029 B2 | 12/2018 | Parthasarathy et al. | |
| 10,177,566 B2 | 1/2019 | Zhao et al. | |
| 10,199,369 B2 | 2/2019 | Parthasarathy et al. | |
| 10,249,609 B2 | 4/2019 | Salcedo et al. | |
| 2003/0043523 A1 | 3/2003 | Hung et al. | |
| 2007/0025034 A1 | 2/2007 | Chaudhary et al. | |
| 2007/0247772 A1 | 10/2007 | Keppens et al. | |
| 2008/0310061 A1 | 12/2008 | Jeon et al. | |
| 2009/0268359 A1 | 10/2009 | Chatty et al. | |
| 2013/0215541 A1 | 8/2013 | Karp | |
| 2016/0204096 A1 | 7/2016 | Zhao et al. | |
| 2016/0261110 A1 | 9/2016 | Ivanov et al. | |
| 2016/0285255 A1 | 9/2016 | O'Donnell et al. | |
| 2016/0300830 A1 | 10/2016 | Salcedo et al. | |
| 2016/0336740 A1 | 11/2016 | Parthasarathy et al. | |
| 2016/0336744 A1 | 11/2016 | Parthasarathy et al. | |
| 2017/0194317 A1 | 7/2017 | Wallis | |
| 2017/0243862 A1 | 8/2017 | Parthasarathy et al. | |
| 2017/0256534 A1 | 9/2017 | Parthasarathy et al. | |
| 2017/0317070 A1 | 11/2017 | Salcedo et al. | |
| 2018/0026029 A1 | 1/2018 | Lin et al. | |
| 2018/0026440 A1 | 1/2018 | Zhao et al. | |
| 2018/0158814 A1 | 6/2018 | Salcedo et al. | |
| 2018/0211951 A1 | 7/2018 | Luo et al. | |
| 2018/0226788 A1 | 8/2018 | Salcedo et al. | |

FOREIGN PATENT DOCUMENTS

| | | |
|---|---|---|
| EP | 2 654 080 A1 | 10/2013 |
| EP | 2 975 718 A1 | 1/2016 |
| EP | 3 054 481 A1 | 8/2016 |
| EP | 2 526 618 B1 | 8/2018 |
| KR | 10-0814437 B1 | 3/2008 |
| KR | 2008-0034227 A | 4/2008 |
| WO | WO 2011/139459 A3 | 11/2011 |

OTHER PUBLICATIONS

Ker et al., "ESD Protection Circuits with Novel MOS-Bounded Diode Structures" IEEE 2002, in 4 pages.

Koo, et al., "Design of Gate-Ground-NMOS-Based ESD Protection Circuits with Low Trigger Voltage, Low Leakage Current, and Fast Turn-On" ETRI Journal, vol. 31, No. 6, Dec. 2009, in 7 pages.

Ward, Scott T., "Electrostatic Discharge (ESD) Protection in CMOS" A Thesis Presented in Partial Fulfillment of the Requirements for the Degree of Master of Science with a Major in Electrical Enginerring in the College of Graduate Studies University of Idaho, Dec. 2002, in 113 pages.

* cited by examiner

US 10,581,423 B1

FAULT TOLERANT LOW LEAKAGE SWITCH

CROSS-REFERENCE TO RELATED APPLICATIONS

The present application claims priority to U.S. Provisional Patent Application No. 62/719,282, filed Aug. 17, 2018, and titled "FAULT TOLERANT LOW LEAKAGE SWITCH," the entirety of which is hereby incorporated herein by reference.

FIELD OF THE DISCLOSURE

Embodiments of the invention relate to electronic systems, and more particularly, to electronic switches with overvoltage protection.

BACKGROUND

Electronic circuits can be exposed to a transient overstress event, or an electrical signal of a relatively short duration having rapidly changing voltage and high power. Transient overstress events include electrostatic discharge (ESD) and/or electrical overstress (EOS) events, such as those arising from the abrupt release of charge from an object or person to an electronic circuit. Transient overstress events can damage an integrated circuit (IC) due to overvoltage conditions and/or high levels of power dissipation over relatively small areas of the IC. High power dissipation can increase circuit temperature, and can lead to numerous problems, such as junction damage, metal damage, and/or surface charge accumulation.

SUMMARY OF THE DISCLOSURE

Fault tolerant switches are provided herein. In certain embodiments, a fault tolerant switch includes a switch, a driver for opening or closing the switch, and a clamp in parallel with the switch and operable to provide overvoltage protection to the switch. The teachings herein can be used to provide a switch with integrated overvoltage protection, while also achieving a high level of switch performance. For example, the fault tolerant switch can operate with low power dissipation when the switch is opened, and with high reliability in the presence of EOS events, ESD events, and/or fault conditions. Furthermore, the on-state impedance of the switch can be tightly controlled by the driver, thereby facilitating accurate signal processing when the switch is closed to receive a signal current.

In one aspect, a semiconductor die with fault tolerant switching is provided. The semiconductor die includes a first pad and a second pad, a switch including a switch p-type field effect transistor (PFET) and a switch n-type field effect transistor (NFET) electrically connected in series between the first pad and the second pad, a gate driver configured to control a gate voltage of the switch PFET and a gate voltage of the switch NFET, and a clamp electrically connected in parallel with the switch. The clamp includes a forward protection circuit including a first diode and a first clamp FET in series between the first pad and the second pad, and a first gate bias circuit configured to bias a gate of the first clamp FET.

In another aspect, a fault tolerant switch with integrated overvoltage protection is provided. The fault tolerant switch includes a switch including a switch PFET and a switch NFET electrically connected in series between a first node and a second node, means for controlling a gate voltage of the switch PFET and a gate voltage of the switch NFET, and a clamp electrically connected in parallel with the switch, the clamp including a forward protection circuit including a first diode and a first clamp FET in series between the first node and the second node, and means for biasing a gate of the first clamp FET.

In another aspect, a method of fault tolerant switching in a semiconductor die is provided. The method includes controlling a switch using a gate driver, including biasing a switch PFET and a switch NFET that are in series. The method further includes protecting the switch from overvoltage using a clamp that is in parallel with the switch between a first pad and a second pad, including conducting a forward current through a first diode and a first clamp FET in response to an overstress event between the first pad and the second pad. The method further includes biasing a gate of the first clamp FET using a first gate bias circuit.

DETAILED DESCRIPTION OF EMBODIMENTS

Figure 1:
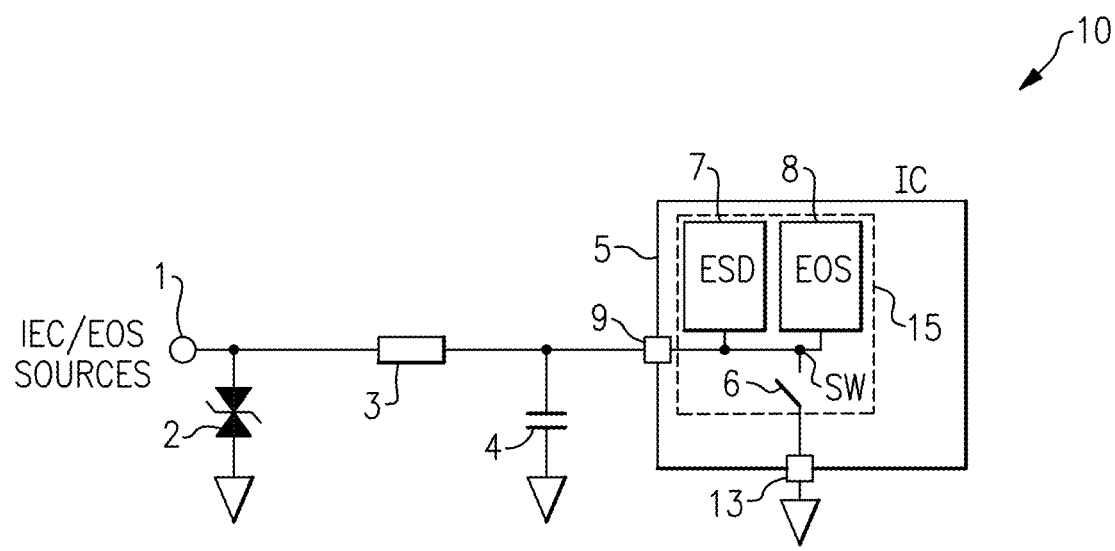
FIG. 1 is a schematic diagram of one embodiment of an electronic system including a fault tolerant switch.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical overstress (EOS) events, including electrostatic discharge (ESD) events.

In certain applications, it is desirable for a semiconductor die or chip to include a switch coupled to the chip's interface. For example, such a switch can be selectively opened or closed to receive a signal current, which can be further processed by circuitry of the chip. For instance, the voltage across the switch can be amplified and/or otherwise processed to provide signal current sensing.

Although coupling a switch to a chip's interface aids in sensing signal current, coupling the switch to pads of the interface exposes the switch to ESD and/or EOS events received at the pads. Furthermore, the switch can be exposed to fault conditions, such as inadvertent or accidental application of a power supply voltage to the pads coupled to the switch.

The teachings herein can be used to provide overvoltage protection to such a switch, while also maintaining switch performance. For example, the teachings herein can be used to achieve low leakage when the switch is opened or off, while also providing robust reliability to the switch in the presence of EOS events, ESD events, and/or fault conditions on the interface. Furthermore, the on-state impedance of the switch can be tightly controlled, thereby facilitating accurate signal processing when the switch is closed to receive a signal current.

Fault tolerant switches are provided herein. In certain embodiments, a fault tolerant switch includes a switch, a gate driver, and a clamp. The switch includes a switch p-type field effect transistor (PFET) and a switch n-type field effect transistor (NFET) electrically connected in series and controlled by the gate driver. Additionally, the clamp is electrically connected in parallel with the switch, and includes a forward protection circuit including a first diode and a first clamp FET in series, and a reverse protection circuit including a second diode and a second clamp FET in series. The clamp further includes a first gate bias circuit configured to bias a gate of the first clamp FET and a second gate bias circuit configured to bias a gate of the second clamp FET.

By implementing the fault tolerant switch in this manner, robust protection against overstress conditions is provided, while also achieving low leakage. For example, the gate bias circuits of the clamp serve to bias the clamp FETs with low leakage, while the diodes serve to provide reverse voltage blocking. Additionally, the gate driver biases the transistors of the switch to turn on and off the switch, while maintaining desired control over on-state and off-state switch impedance.

In certain implementations, the switch is coupled between a switch node and ground, and is selectively opened or closed to receive a signal current. The switch node and the ground node can be exposed to overstress events, such as ESD and/or EOS events. For example, the fault tolerant switch can be fabricated on a semiconductor die, and the switch node can be connected to a first pin or pad of the die's interface while the ground node can be coupled to a second pad of the die's interface. Although an external protection circuit, such as a transient-voltage suppression (TVS) diode can be externally connected to the switch node for ESD protection, the TVS diode may have a relatively slow activation time and/or too high of an activation threshold to reliably protect the switch.

Accordingly, the fault tolerant switch is implemented with integrated clamp circuitry for maintaining reliability over a wide range of operating conditions. Moreover, such integrated protection can protect the switch from damage in response to an overstress event received at the chip pad during a time before the TVS diode and/or other external protection structure activates.

In certain implementations, the switch is further implemented with gate-to-source clamps for the switch PFET and/or the switch NFET. Such clamps aid in maintaining the reliability of the switch by limiting transistor gate-to-source voltages. For example, the switch PFET and the switch NFET can be implemented using metal oxide semiconductor (MOS) transistors, which can suffer from gate oxide breakdown upon application of a large gate-to-source voltage.

Such gate-to-source clamps can be implemented in a wide variety of ways. For example, two or more diodes (for instance, p-n junction diodes and/or diode-connected transistors) can be connected in series to achieve a desired trigger voltage for clamping.

In certain implementations, the switch NFET and/or switch PFET is further protected by a gate clamp for clamping the transistor's gate to a reference voltage, for instance, a supply voltage or ground. In one example, a gate clamp is provided between the gate of the switch PFET and a negative supply voltage. Such gate clamps can enhance the reliability of transistors of the switch, and can be included in addition to or alternatively to a gate-to-source clamp. The gate clamps can be implemented in a wide variety of ways, including, but not limited to, using two or more diodes in series between the transistor gate and the reference voltage.

The gate driver includes driver transistors used to control the gate voltages of the switch PFET and the switch NFET, thereby opening or closing the switch. To ensure the driver transistors of the gate driver operate within reliable operating voltage ranges, in certain implementations one or more blocking diodes are included to prevent the inadvertent flow of reverse current that can lead to excessive bias voltages. In one example, the gate driver includes a driver PFET for controlling a gate voltage of the switch with a supply voltage, and a blocking diode is included in series with the driver PFET to prevent the reverse flow of current through the driver PFET to the supply voltage.

The first clamp FET and the second clamp FET can be implemented in a variety of ways, including, for example, using MOS transistors. The gate of the first clamp FET is biased by the first gate bias circuit, which in certain implementations includes two or more diodes electrically connected in series. Implementing a gate bias circuit in this manner aids in providing a low leakage bias condition, thereby enhancing the off-state performance of the fault tolerant switch.

The gate of the second clamp FET is biased by the second gate bias circuit, which can also be implemented using two or more diodes in series to achieve biasing conditions suitable for low leakage operation. The number of diodes included in the first gate bias circuit and the second gate bias circuit need not be the same, but rather can be selected to achieve desired performance characteristics. In certain implementations, the diodes used for biasing are implemented using diode-connected transistors. Additionally, a body bias circuit is included for biasing the bodies of the diode-connected transistors to reduce off-state leakage, thereby providing a further enhancement to off-state leakage characteristics.

In certain implementations, triggering circuits, such as resistor-capacitor (RC) trigger networks are included in the clamp to detect the presence of positive and negative polarity overstress events. Such triggering circuits can control gate voltages to activate the first clamp FET and the second clamp FET in response to overstress events of positive and negative polarity, respectively.

Accordingly, protection against both positive and negative polarity overvoltage is provided, thereby providing bidirectional overstress protection. For example, when the switch is coupled between a switch node and ground, the first clamp FET is activated to provide protection against overstress events that increase the voltage of the switch node relative to ground, while the second clamp FET is activated to provide protection against overstress events that decrease the voltage of the switch node relative to ground.

The first clamp FET is placed in series with the first diode, which is poled such that a forward current passes through the forward protection circuit and a reverse current through the forward protection circuit is blocked. Additionally, the second clamp FET is placed in series with the second diode, which is poled such that a forward current through the reverse protection circuit is blocked and a reverse current passes through the reverse protection circuit. Accordingly, inclusion of the first diode and the second diode in the clamp aid in directed currents of desired polarity through the clamp's forward protection circuit and reverse protection circuit, thereby aiding in proper clamping.

FIG. 1 is a schematic diagram of one embodiment of an electronic system 10. The electronic system 10 includes a system pin 1, a transient-voltage suppression (TVS) diode 2, a resistor 3, a capacitor 4, and a semiconductor die 5. The semiconductor die 5 includes a signal pin or pad 9, a ground pad 13, and a fault tolerant switch 15. A semiconductor die is also referred to herein as an integrated circuit (IC) or semiconductor chip. As shown in FIG. 1, the fault tolerant switch 15 includes a switch component 6, an ESD protection component 7, and an EOS protection component 8. The fault tolerant switch 15 can be implemented in accordance with any of the embodiments herein.

The electronic system 10 illustrates one embodiment of an electronic system including a semiconductor die having an electrical interface implemented in accordance with the teachings herein. Although one embodiment of an electronic system is shown, the teachings herein are applicable to electronic systems implemented in a wide variety of ways. Although not depicted in FIG. 1, the semiconductor die 5 can include additional circuitry and pads, which have been omitted from FIG. 1 for clarity.

In the illustrated embodiment, the system pin 1, the TVS diode 2, the resistor 3, and capacitor 4 are implemented externally to the semiconductor die 5. For instance, in one example, the semiconductor die 5 is included on a module, and the TVS diode 2, the resistor 3, and the capacitor 4 correspond to other components of the module, such as surface mount components. In another example, the electronic system 10 is implemented on a circuit board with the TVS diode 2, the resistor 3, the capacitor 4, and the semiconductor die 5 attached as components thereto.

As shown in FIG. 1, the switch component 6 is electrically connected between a switch node (SW) and a ground node. Additionally, SW is connected to the signal pad 9, and the ground node is coupled to the ground pad 13. The switch component 6 is implemented on-chip and can provide a number of functions. For example, the switch component 6 can be used to control a common-mode voltage of SW and/or to conduct a signal current. For instance, signal processing circuitry can be used to sense the voltage across the switch component 6 when the switch component 6 is closed.

In certain implementations, the switch component 6 is controlled by a register (not shown in FIG. 1). The resistivity of the switch component 6 when closed can vary based on application. In one example, the switch component 6 provides about a 1 kΩ resistive path between SW and ground. Although one example of switch resistivity is provided, other implementations are possible, such as resistivity selected based on target application.

The voltage range of the system pin 1 can vary during operation and/or based on whether the chip is powered or unpowered. In one example, the voltage of SW operates with a voltage range of about −1.6V to about 2.4V. When operating over the voltage range, the fault tolerant switch 15 can be specified to operate with a particular off-state leakage constraints, for instance, off-state leakage of less than about 5 nA at about 35° C. Although various example operating and performance parameters have been described, other implementations are possible.

The system pin 1 can receive a variety of overvoltage events, such as EOS and/or ESD events. Moreover, the system pin 1 can operate with relatively large voltage range, for instance, +/−30V.

Figure 2:
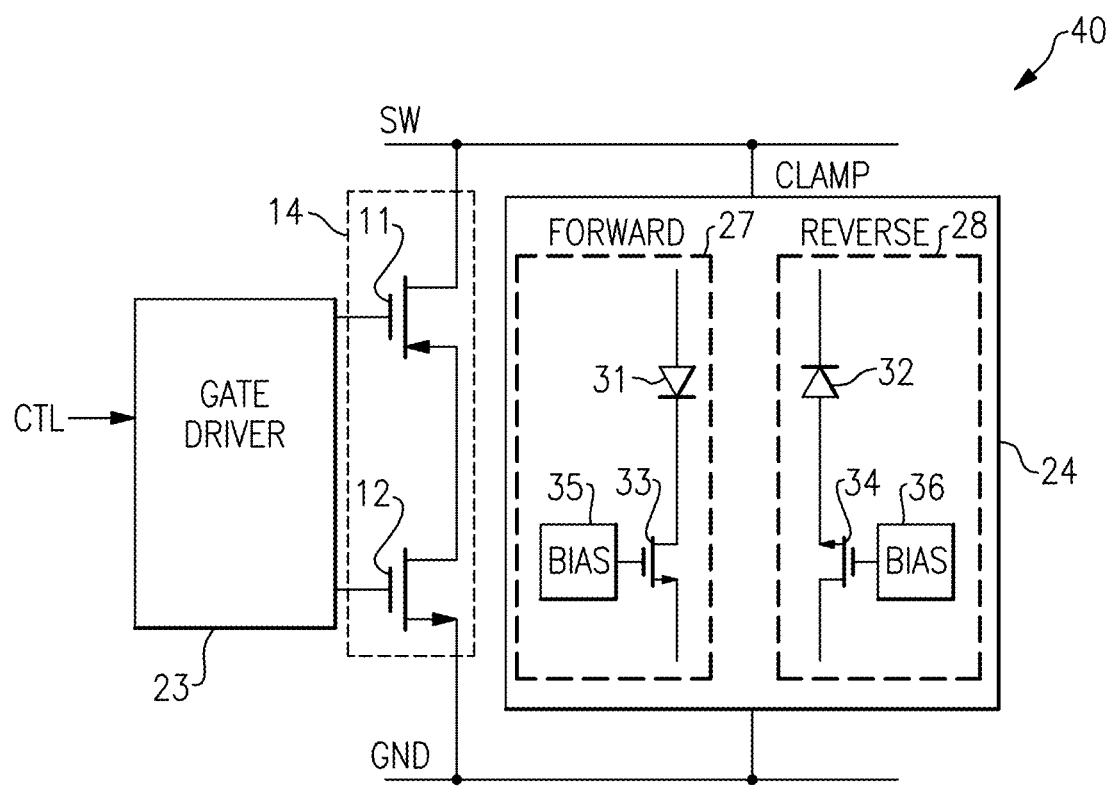
FIG. 2 is a schematic diagram of a fault tolerant switch according to one embodiment.

FIG. 2 is a schematic diagram of a fault tolerant switch 40 according to one embodiment. The fault tolerant switch 40 includes a switch 14, a gate driver 23, and a clamp 24. As shown in FIG. 2, the switch 14 includes a p-type metal oxide semiconductor (PMOS) switch transistor 11 and an n-type metal oxide semiconductor (NMOS) switch transistor 12.

Although an embodiment with MOS transistors are shown, other implementations are possible. For instance, other types of field effect transistors that omit gate oxide (for instance, metal-semiconductor field effect transistors or MESFETs) can be used.

As shown in FIG. 2, the PMOS switch transistor 11 and the NMOS switch transistor 12 are electrically connected in series between a switch node (SW) and a ground node (GND) to serve as the switch 14. Additionally, the gate driver circuit 23 controls the gate voltages of the PMOS switch transistor 11 and the NMOS switch transistor 12 to open or close the switch 14.

In certain implementations, the gate driver circuit 23 provides level-shifting. For example, the gate driver circuit 23 can receive one or more input control signals (CTL) from a first voltage domain, and output gate control voltages for the PMOS switch transistor 11 and the NMOS switch transistor 12 in a second voltage domain. In certain implementations, CTL is received from on-chip registers (for instance, the register 411 of FIG. 14). However, other implementations are possible.

The fault tolerant switch 40 includes a clamp 24, which includes a forward protection circuit 27 and a reverse protection circuit 28. The forward protection circuit 27 provides protection against overstress that increases the voltage of SW relative to GND, while the reverse protection circuit 28 provides protection against overstress that decreases the voltage of SW relative to GND. Thus, the clamp 24 operates bidirectionally to enhance the robustness of the fault tolerant switch 40 to overstress of both positive polarity and negative polarity.

In the illustrated embodiment, the forward protection circuit 27 includes a first diode 31 and a first NMOS clamp transistor 33, which are electrically connected in series between SW and GND. Additionally, the forward protection circuit 27 includes a first gate bias circuit 35 for biasing the gate of the first NMOS clamp transistor 33. The reverse protection circuit 28 includes a second diode 32 and a second NMOS clamp transistor 34, which are electrically connected in series between SW and GND. Additionally, the reverse protection circuit 28 further includes a second gate bias circuit 36 for biasing the gate of the second NMOS clamp transistor 34. In this example, NMOS clamp transistors are used in the clamp 24. However, other implementations are possible.

As shown in FIG. 2, the first diode 31 is connected from anode to cathode between SW and GND, while the second diode 32 is connected from cathode to anode between SW and GND. Implementing the first diode 31 and second diode 32 in this manner provides voltage blocking that prevents the forward protection circuit 27 from activating for negative polarity overstress and that prevents the reverse protection circuit 28 from activating for positive polarity overstress. In certain implementations, the first diode 31 and the second diode 32 are implemented using p-n junction diodes, diode-connected transistors, or a combination thereof. However, other implementations are possible.

By including the clamp 24, the robustness of the switch 14 to overstress is enhanced.

In certain implementations, the gate driver 23 and/or the switch 14 is implemented with protection features to enhance tolerance to overvoltage and/or harsh electrical operating conditions. Additionally or alternatively, the clamp 24 is implemented to operate with low leakage, for instance, implementing the first gate bias circuit 35 and the second gate bias circuit 36 to bias the first clamp transistor and the second clamp transistor 36, respectively, for low static power dissipation while maintaining suitable clamping.

Figure 3:
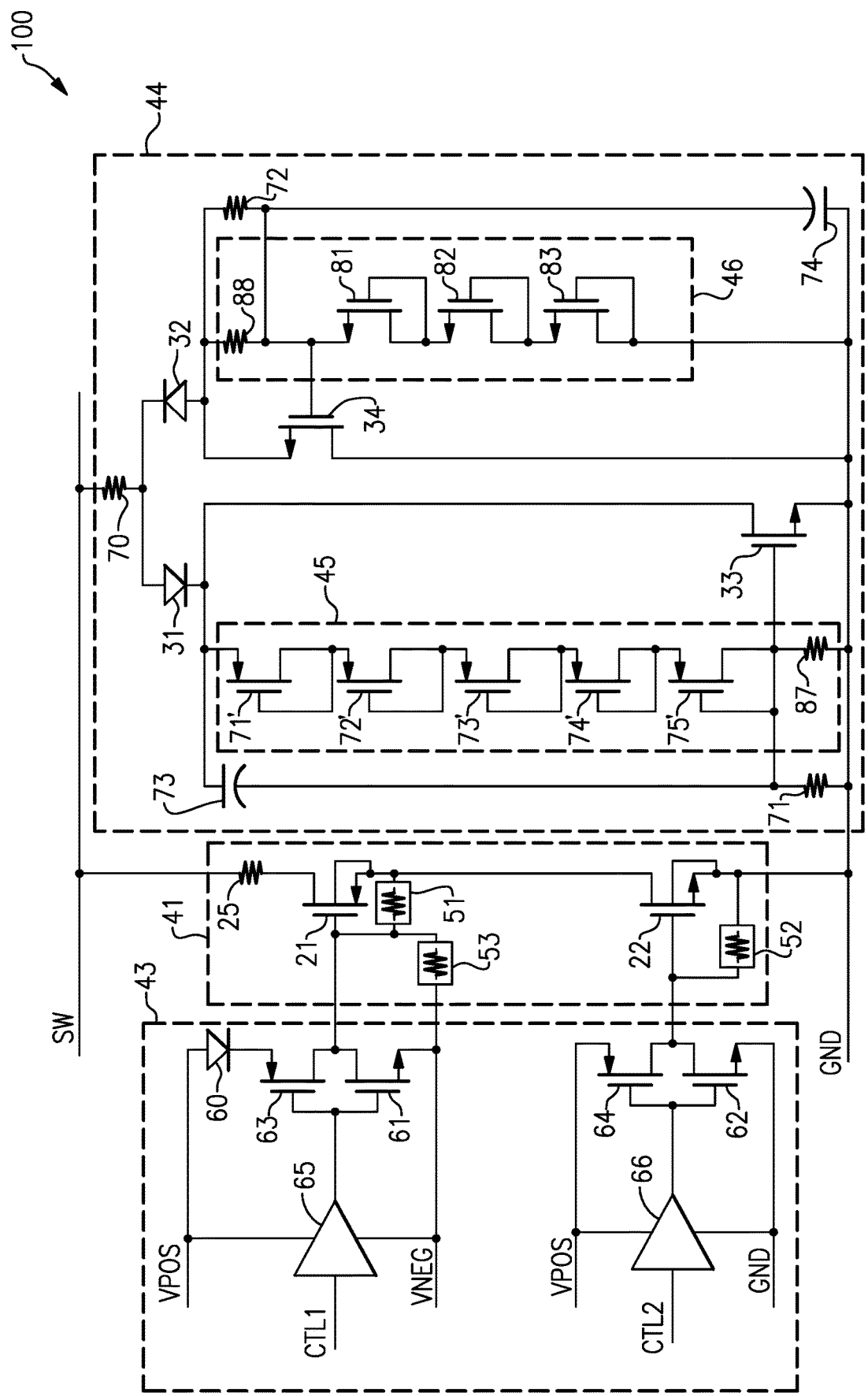
FIG. 3 is a schematic diagram of a fault tolerant switch according to another embodiment.

FIG. 3 is a schematic diagram of a fault tolerant switch 100 according to another embodiment. The fault tolerant switch 100 includes a switch 41, a gate driver 43, and a clamp 44. As shown in FIG. 3, the switch 41 and the clamp 44 are electrically connected in parallel with one another between SW and GND.

In the illustrated embodiment, the switch 41 includes a PMOS switch transistor 21, an NMOS switch transistor 22, and a series switch resistor 25. To provide enhanced robustness against a range of switch biasing conditions, the switch 41 further includes a first gate clamp 51, a second gate clamp 52, and a third gate clamp 53.

As shown in FIG. 3, the gate driver 43 includes a blocking diode 60, a first NMOS driver transistor 61, a first PMOS driver transistor 63, a first input buffer 65, a second NMOS driver transistor 62, a second PMOS driver transistor 64, and a second input buffer 66.

The first input buffer 65 is powered by a positive supply voltage (VPOS) and a negative supply voltage (VNEG). In one example, VPOS and VNEG have a nominal voltage level of about +1.6 V and −1.6 V, respectively. However, other implementations are possible. As shown in FIG. 3, the blocking diode 60, the first PMOS driver transistor 63, and the first NMOS driver transistor 61 are electrically connected in series between VPOS and VNEG. Additionally, the gates of the first NMOS driver transistor 61 and the first PMOS driver transistor 63 are controlled by an output of the first input buffer 65.

With continuing reference to FIG. 3, the second input buffer 66 is powered by VPOS and GND. Additionally, the second PMOS driver transistor 64 and the second NMOS driver transistor 62 are electrically connected in series between VPOS and GND. Additionally, the gates of the second NMOS driver transistor 62 and the second PMOS driver transistor 64 are controlled by an output of the second input buffer 66.

In the illustrated embodiment, the first input buffer 65 receives a first control input (CTL1), and the second input buffer 66 receives a second control input (CTL2). In certain implementations, CTL1 and CTL2 are commonly controlled, for instance, by a switch control signal used to control the gates of the PMOS switch transistor 21 and the NMOS switch transistor 22 to open or close the switch. Although CTL1 and CTL2 can be commonly controlled during normal operation, transient switching and/or uncontrolled initialization conditions during start-up or chip power-on can result in CTL1 and CTL2 having different values. Thus, the biasing of the gate voltages of the PMOS switch transistor 21 and the NMOS switch transistor 22 have a range of voltage conditions.

For example, not only can both the NMOS and PMOS switch transistors be turned off or on together to open or close the switch, but the NMOS switch transistor 21 can be turned on and the PMOS switch transistor 22 turned off, or vice versa. Moreover, biasing can be complicated by conditions in which VPOS and VNEG are not present (for instance, when the chip is unpowered or a portion of the chip including the fault tolerant switch 100 is unpowered) and/or by a DC voltage level of SW.

By including one or more of the gate clamps 51-53, the robustness of the NMOS switch transistor 21 and the PMOS switch transistor 22 is enhanced over varying switch biasing conditions.

In the illustrated embodiment, the first gate clamp 51 is connected between the gate and the source of the PMOS switch transistor 21, while the second gate clamp 52 is connected between the gate and the source of the NMOS switch transistor 22. Thus, the first gate clamp 51 and the second gate clamp 52 serve as gate-to-source ($V_{GS}$) clamps that clamp the gate voltage relative to the source voltage. Additionally, the third gate clamp 53 is connected between the gate of the PMOS switch transistor 21 and VNEG, and aids in clamping the gate voltage relative to VNEG.

As shown in FIG. 3, a body and a source of the PMOS switch transistor 21 are connected to one another, and a body and a source of the NMOS switch transistor 22 are connected to one another. Although one implementation of body biasing is shown, other implementations are possible, including, but not limited to, implementations in which a body biasing circuit is included to bias the body of the PMOS switch transistor 21 and/or the body of the NMOS switch transistor 22 to achieve low off-state leakage.

In the illustrated embodiment, the blocking diode 60 is included between VPOS and a source of the first PMOS driver transistor 63. The blocking diode 60 provides isolation during a power down condition, for instance, when the illustrated voltage supplies and ground operate at the same electrical potential.

The isolation provided by the blocking diode 60 also helps to protect the gate-oxide of the transistors of the switch 41. For instance, the blocking diode 60 can aid in preventing voltage build-up across the gate-to-drain junction of the PMOS switch transistor 21, thereby enhancing gate-oxide reliability. The blocking diode 60 further aids in reducing leakage current to achieve low static power dissipation.

With continuing reference to FIG. 3, the clamp 44 includes a blocking resistor 70, a first diode 31, a second diode 32, a first clamp NMOS transistor 33, a second clamp NMOS transistor 34, a first gate bias circuit 45, a second gate bias circuit 46, a first trigger resistor 71, a first trigger capacitor 73, a second trigger resistor 72, and a second trigger capacitor 74.

The first gate bias circuit 45 includes diode-connected PMOS transistors 71', 72', 73', 74', and 75' (five, in this example) and a resistor 87 in series. Although five transistors are shown, more or fewer transistors can be included in series. The first gate bias circuit 45 controls a DC gate bias voltage of the first NMOS clamp transistor 33 to provide low leakage current biasing. The number of diodes (for instance, p-n junction diodes and/or diode-connected transistors) can aid in controlling a trigger voltage of the first NMOS clamp transistor 33.

In this embodiment, the first trigger resistor 71 and the first trigger capacitor 73 are included to provide coupling that enhances a turn-on speed of the first NMOS clamp transistor 33 in response to a positive polarity overstress event at SW. In another embodiment, the first trigger resistor 71 and the first trigger capacitor 73 are omitted in favor of using the first gate bias circuit 45 to activate the first NMOS clamp transistor 33 in response to overstress.

The second gate bias circuit 46 includes diode-connected NMOS transistors 81-83 (three, in this example) and a resistor 88 in series, and operates to control a DC gate bias voltage of the second NMOS clamp transistor 34 to provide low leakage current biasing. Although three transistors are shown, more or fewer transistors can be included in series. The number of diodes (for instance, p-n junction diodes and/or diode-connected transistors) can aid in controlling a trigger voltage of the second NMOS clamp transistor 34. In this embodiment, the second trigger resistor 72 and the second trigger capacitor 74 are included to provide coupling that enhances a turn-on speed of the second NMOS clamp transistor 34 in response to a negative polarity overstress event at SW. In another embodiment, the second trigger resistor 72 and the second trigger capacitor 74 are omitted.

Figure 4A:
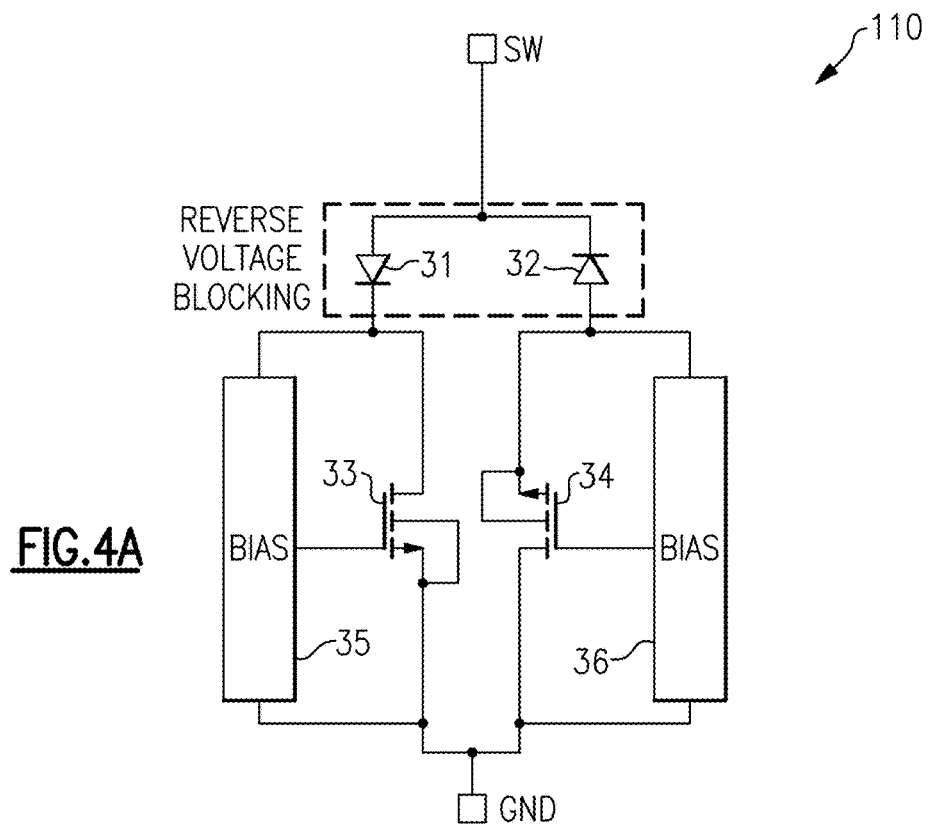
FIG. 4A is a schematic diagram of one embodiment of a clamp for a fault tolerant switch.

FIG. 4A is a schematic diagram of one embodiment of a clamp 110 for a fault tolerant switch. The clamp 110 includes a first diode 31, a second diode 32, a first NMOS clamp transistor 33, a second NMOS clamp transistor 34, a first gate bias network or circuit 35, and a second gate bias circuit 36. The clamp 110 is connected between SW and GND, in this embodiment.

Inclusion of the first diode 31 and the second diode 32 aids in providing reverse blocking to thereby operate for both positive and negative voltage differences between SW and GND. In one example, the first NMOS clamp transistor 33 and the second NMOS clamp transistor 34 are implemented using 3.3V NMOS devices. However, other implementations are possible.

The first gate bias circuit 35 and the second gate bias circuit 36 can be implemented in a wide variety of ways, including, but not limited to, using junction diodes and/or diode-connected MOS transistors for biasing.

In certain implementations, the clamp 110 provides protection against both ESD and EOS events.

The clamp 110 can be implemented for a wide variety of design windows. In one example, the clamp 110 is implemented to provide below 5 nA leakage for −1.6V and 2.3V 35° C., while clamping sufficient current to prevent damage from overvoltage arising before a TVS diode (for instance, the TVS diode 2 of FIG. 1) can turn on to provide protection.

Figure 4B:
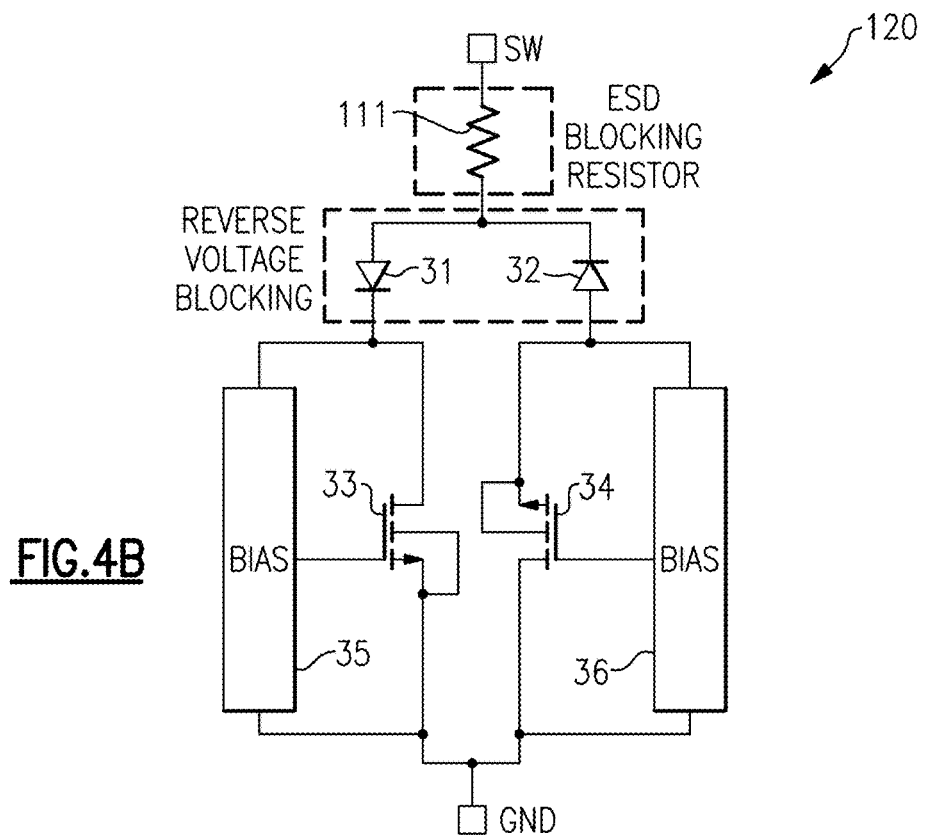
FIG. 4B is a schematic diagram of another embodiment of a clamp for a fault tolerant switch.

FIG. 4B is a schematic diagram of another embodiment of a clamp 120 for a fault tolerant switch. The clamp 120 of FIG. 4B is similar to the clamp 110 of FIG. 4A, except that the clamp 120 of FIG. 4B further includes a blocking resistor 111.

The blocking resistor 111 has resistance sufficiently high to block ESD events, and thus the clamp 120 serves to protect against EOS events but not ESD events. In such implementations, separate ESD protection circuitry can be included on-chip and/or off-chip.

In one embodiment, the clamp 110 of FIG. 4A and/or the clamp 120 of FIG. 4B provides protection to a switch that is turned on or off (for instance, the switch 14 of FIG. 2 or the switch 41 of FIG. 3). Additionally, the gate-to-source voltages ($V_{GS}$) of the NMOS clamp transistors 33-34 are controlled to achieve low leakage when the switch is off and to provide robust clamping when the switch is on. In one example, low leakage is provided for the off state (<100 mV) voltage, while robust clamping is provided for the on state (>500 mV) voltage.

Figure 5:
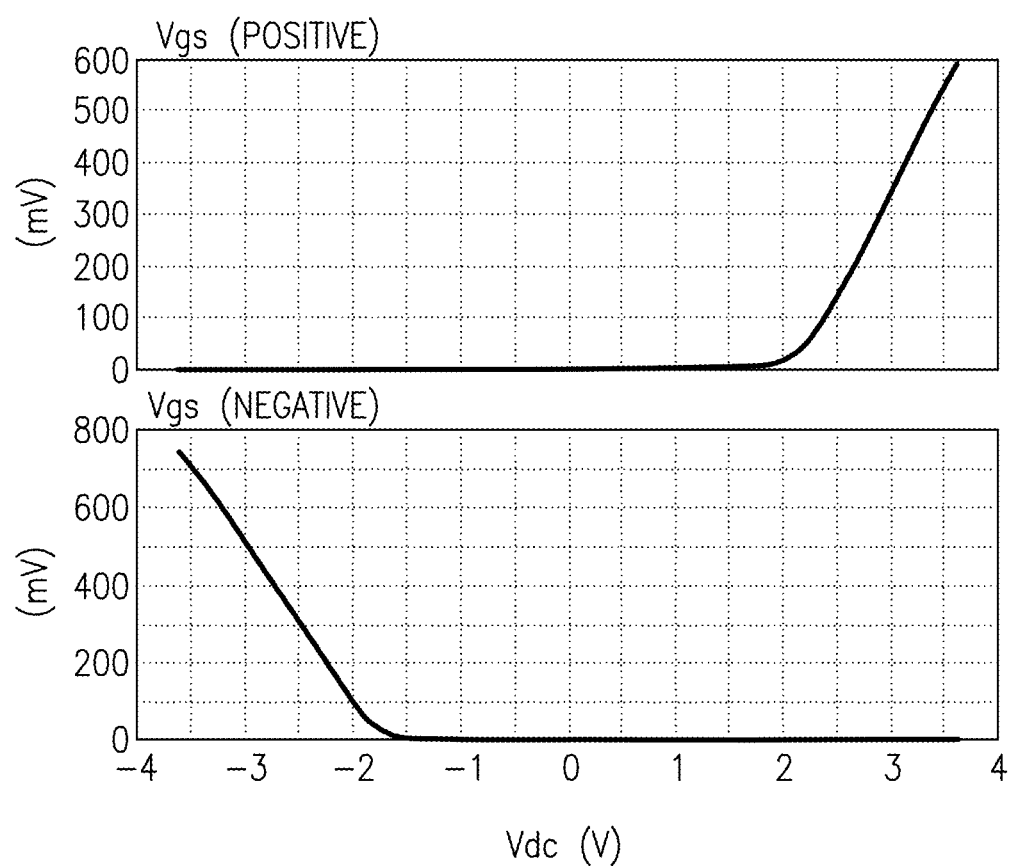
FIG. 5 is a graph of one example of clamping voltage versus gate-to-source voltage for the clamp of FIG. 4B.

FIG. 5 is a graph of one example of clamping voltage versus $V_{GS}$ for the clamp of FIG. 4B. The graph includes a first plot of $V_{GS}$ provided by the first gate bias circuit 35 in response to positive DC voltage between SW and GND, and a second plot of $V_{GS}$ provided by the second gate bias circuit 36 in response to negative DC voltage between SW and GND.

In this example, the first gate bias circuit 35 and the second gate bias circuit 36 are implemented with different circuit implementations to provide desired forward and reverse trigger voltages. For instance, a first number of diodes included in series for the first gate bias circuit 35 can be selected to achieve a desired forward trigger voltage, while a second number of diodes included in series for the second gate bias circuit 36 can be selected to achieve a desired reverse trigger voltage. The first number of diodes and the second number of diodes can be the same or different based on desired clamping characteristics. Although an example of series diodes has been described, the teachings herein are applicable to other implementations of bias circuits.

Figure 6:
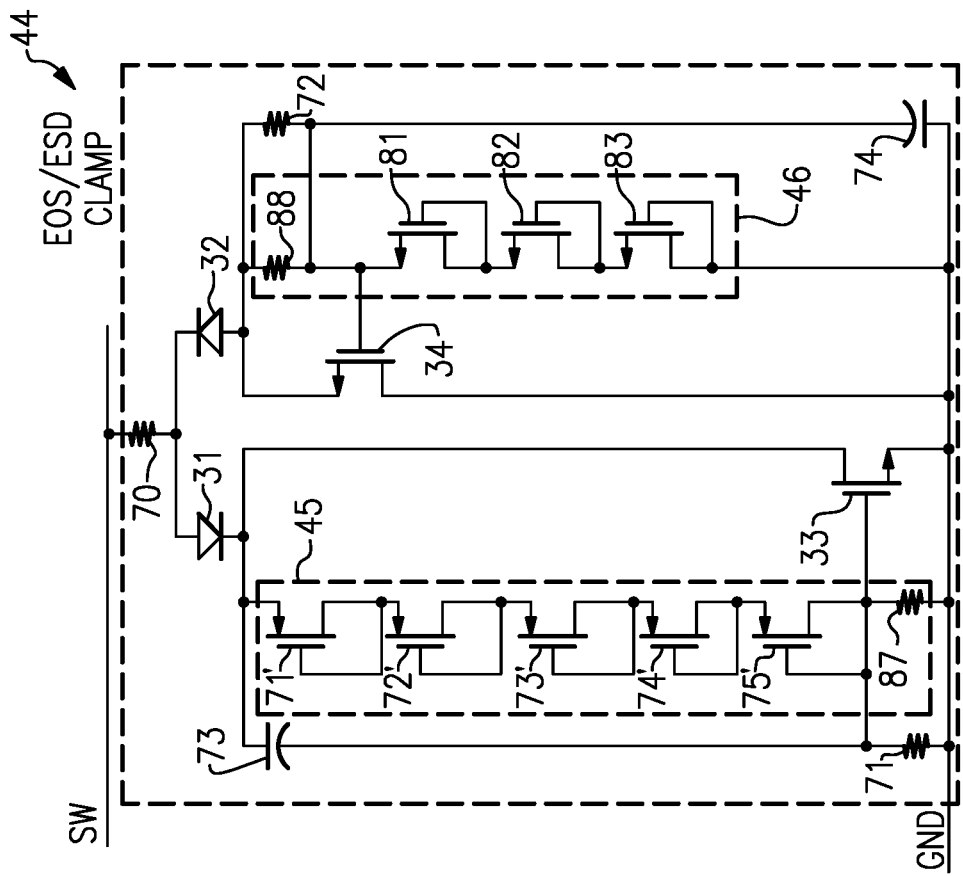
FIG. 6 is a schematic diagram of another embodiment of a clamp for a fault tolerant switch.

FIG. 6 is a schematic diagram of another embodiment of a clamp 44 for a fault tolerant switch. The clamp 44 is as described above with respect to FIG. 3. For example, the clamp 44 includes a blocking resistor 70, a first diode 31, a second diode 32, a first clamp NMOS transistor 33, a second clamp NMOS transistor 34, a first gate bias circuit 45, a second gate bias circuit 46, a first trigger resistor 71, a first trigger capacitor 73, a second trigger resistor 72, and a second trigger capacitor 74.

Figure 7A:
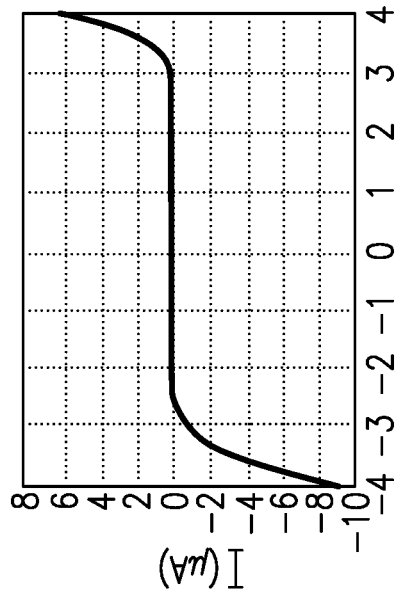
FIG. 7A is a graph of one example of current versus voltage for the clamp of FIG. 6.

FIG. 7A is a graph of one example of current versus voltage for the clamp 44 of FIG. 6. The applied DC voltage corresponds to a voltage difference between SW and GND. As shown in FIG. 7A, example performance for both positive and negative voltage differences is depicted.

Figure 7B:
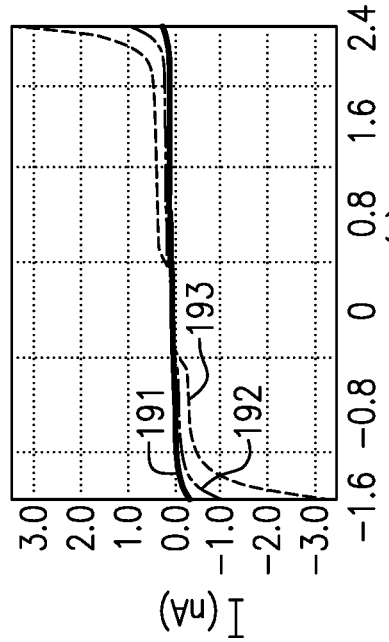
FIG. 7B is a graph of one example of leakage current versus voltage for the clamp of FIG. 6.

FIG. 7B is a graph of one example of leakage current versus voltage for the clamp 44 of FIG. 6. The leakage current is simulated for slow 191, nominal 192, and fast 193 processing corners or models.

Figure 8A:
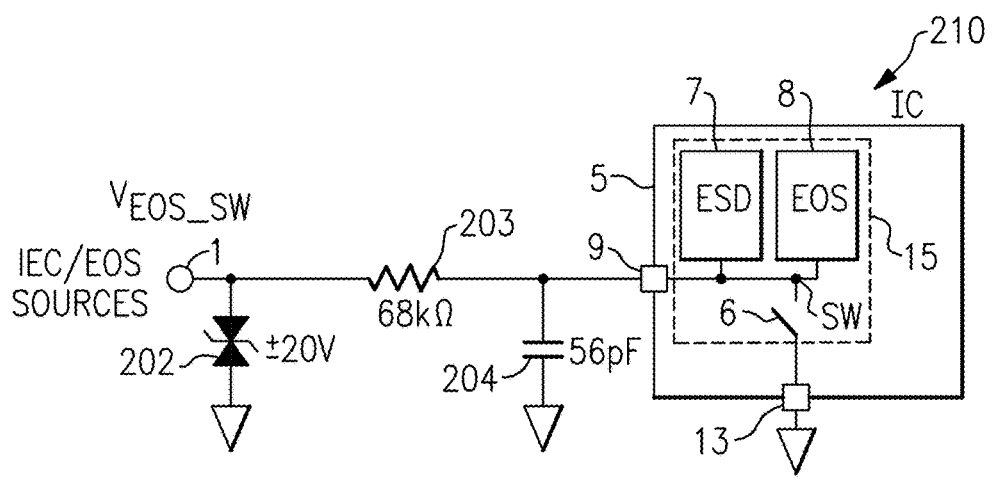
FIG. 8A is a schematic diagram of another embodiment of an electronic system including a fault tolerant switch.

FIG. 8A is a schematic diagram of another embodiment of an electronic system 210 including a fault tolerant switch 15. The electronic system 210 of FIG. 8A is similar to the electronic system 10 of FIG. 1, except that the electronic system 210 illustrates specific component values for the TVS diode 2, the resistor 3, and the capacitor 4 of FIG. 1.

In particular, the electronic system 210 of FIG. 8A includes a TVS diode 202 operating with around +/−20V clamping (for instance, 22 V trigger and 0.7 V on resistance), a resistor 203 having a resistance of about 68 kΩ, and a capacitor 204 having a capacitance of about 56 pF. Although one example of component values is shown, other implementations of component values can be used.

Figure 8B:
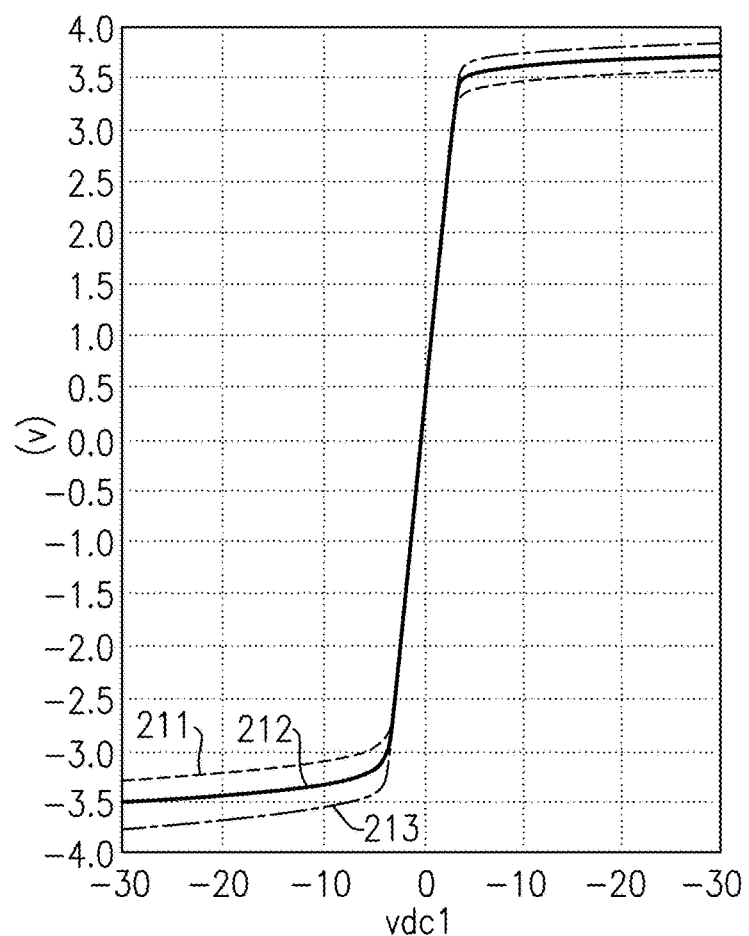
FIG. 8B is a graph of one example of clamping voltage versus overstress voltage for the electronic system of FIG. 8A.

FIG. 8B is a graph of one example of clamping voltage versus overstress voltage for the electronic system 210 of FIG. 8A. The graph depicts simulations of the voltage of SW for fast 211, nominal 212, and slow 213 processing corners.

Figures 9A, 9B:
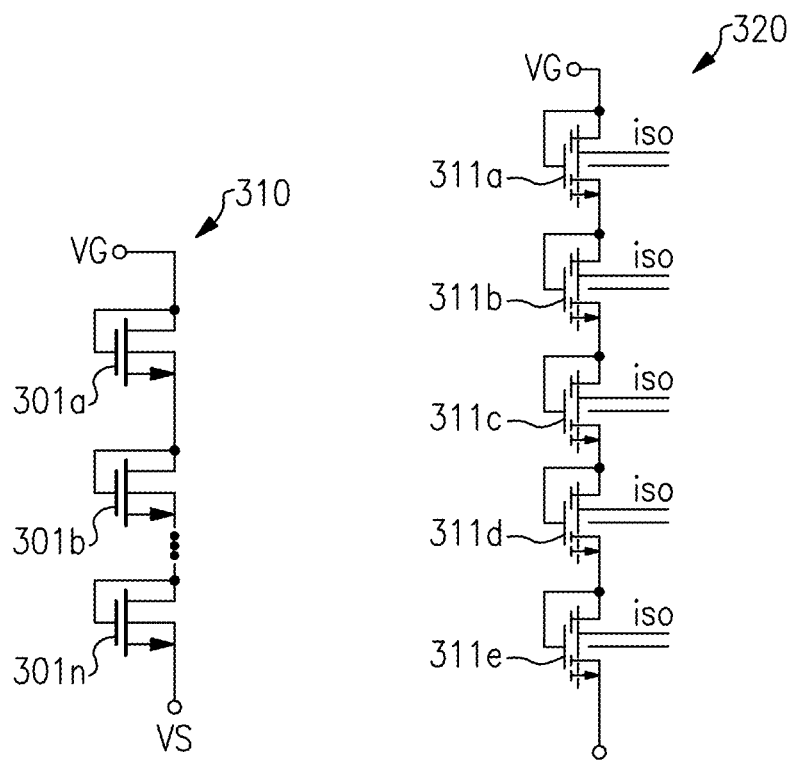
FIG. 9A is a schematic diagram of a gate clamp according to one embodiment.
FIG. 9B is a schematic diagram of a gate clamp according to another embodiment.

FIG. 9A is a schematic diagram of a gate clamp 310 according to one embodiment. The gate clamp 310 includes clamping transistors 301a, 301b, . . . 301n in series between a terminal VG and a terminal VS. Although three transistors are shown, more or fewer transistors can be included in series. In certain implementations, terminal VG is connected to a gate of a MOS transistor and VS is connected to a source of the MOS transistor to provide $V_{GS}$ clamping.

FIG. 9B is a schematic diagram of a gate clamp 320 according to another embodiment. The gate clamp 320 includes five NMOS clamp transistors in series between VG and VS, in this example. In the illustrated embodiment, the NMOS transistors are implemented with deep n-type well (DNW) isolation.

Figure 10:
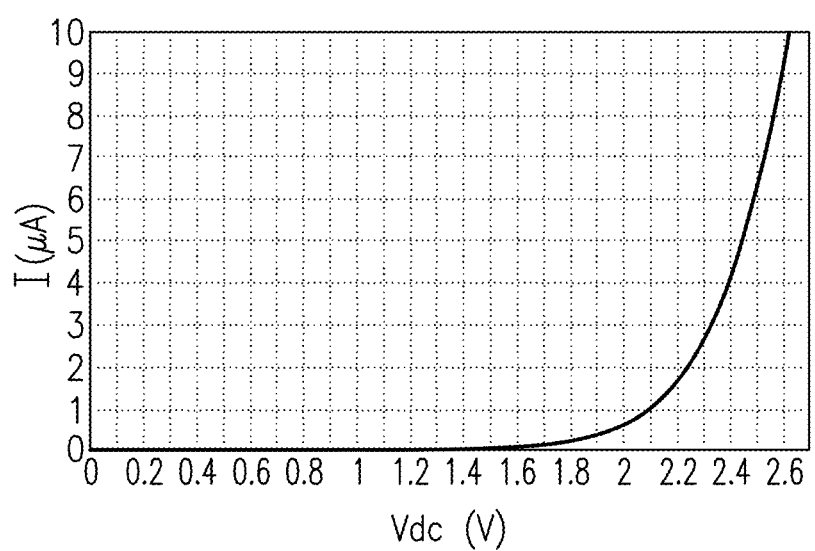
FIG. 10 is a graph of one example of current versus voltage for the gate clamp of FIG. 9B.

FIG. 10 is a graph of one example of current versus voltage for the gate clamp 320 of FIG. 9B. As shown in FIG. 10, as the voltage difference between VG and VS increases, a current flows to provide clamping. By selecting a number of transistors in series, a desired clamping voltage can be achieved.

In this example, stacking five NMOS transistors with DNW isolation achieved 2.1 V of clamping at 1 μA. Increasing the number of stacking can further increase the clamping point.

Figure 11:
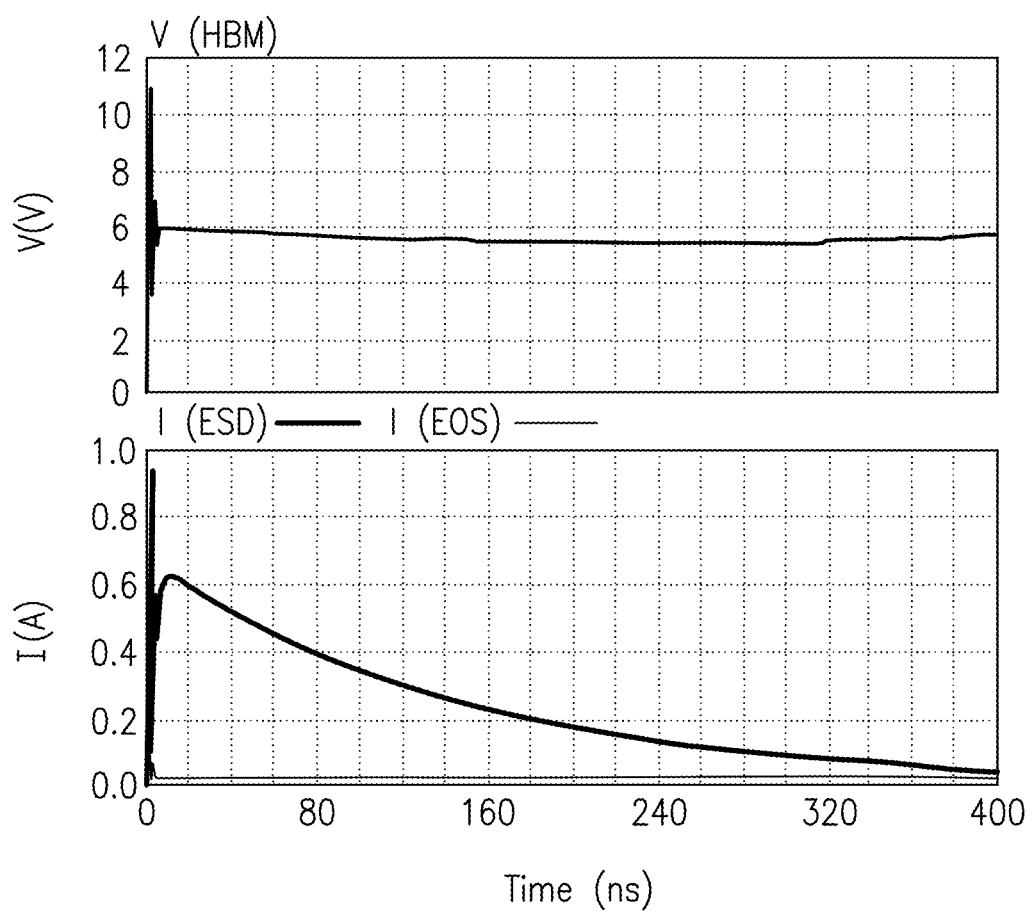
FIG. 11 is a graph of one example of simulated ESD performance for the electronic system of FIG. 8A.

FIG. 11 is a graph of one example of simulated ESD performance for the electronic system 210 of FIG. 8A. The graph includes a human body model (HBM) plots of voltage and current for ESD and EOS events.

Figure 12A:
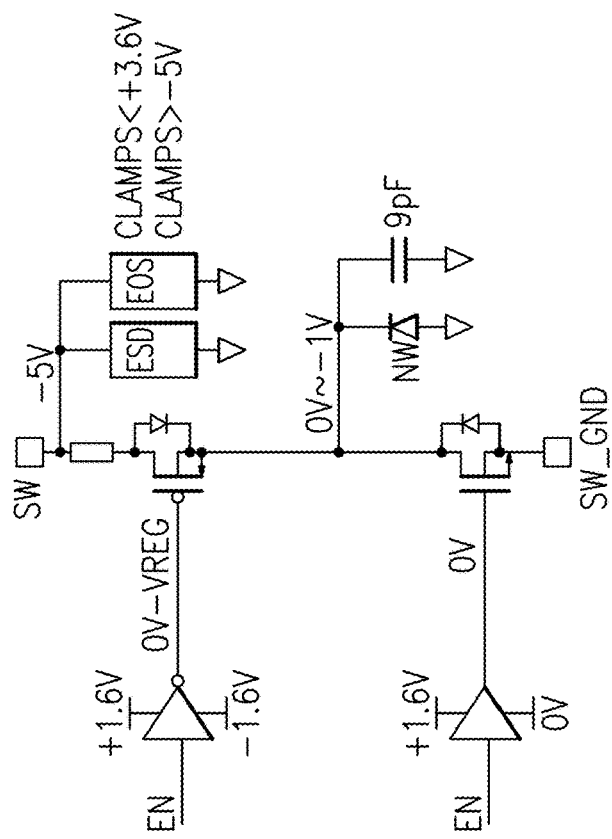
FIG. 12A is a schematic diagram of one example of bias conditions of a switch.
Figure 12B:
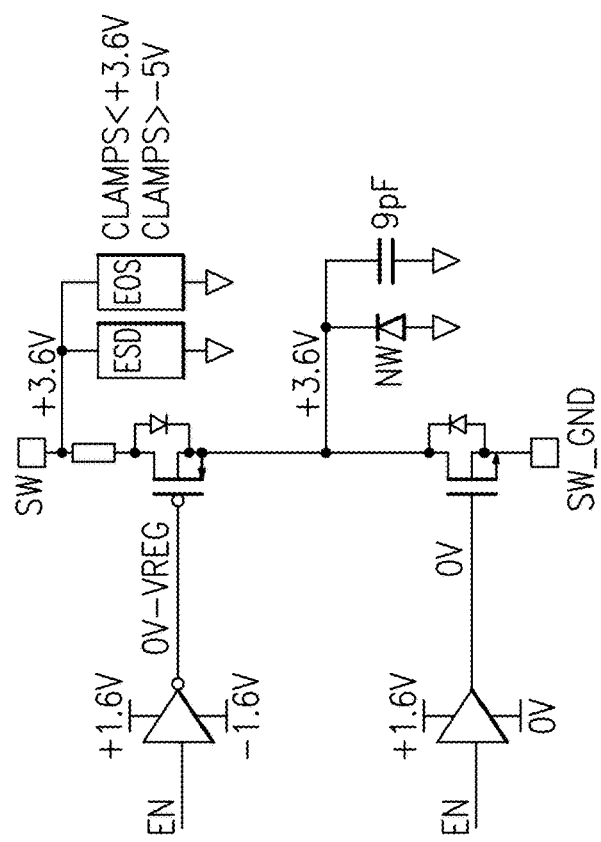
FIG. 12B is a schematic diagram of another example of bias conditions of a switch.

FIGS. 12A and 12B are schematic diagrams of various examples of bias conditions of a switch. In these examples, the NMOS and PMOS transistors are implemented using 5V extended drain devices, and biasing is depicted in the context of the electronic system 210 of FIG. 8A. Additionally, for reliability considerations, an absolute value of the gate-to-drain voltage ($V_{GD}$) is limited to be less than about 5.5 V and an absolute value of the gate-to-source voltage ($V_{GS}$) is limited to be less than about 2.8 V. Although example operating constraints for $V_{GD}$ and $V_{GS}$ have been described, other reliability voltage considerations are possible. For example, such reliability constraints can vary with a number of factors, including, but not limited to, a particular processing technology and/or transistor implementation.

To prevent damage, such as gate oxide damage, the gate bias of the NMOS and PMOS transistors should be controlled across each possible biasing condition to maintain the $V_{GD}$ and $V_{GS}$ within a reliable voltage range.

FIG. 12A is a schematic diagram of one example of bias conditions of a switch. The example is illustrated for a 3.6V positive bias condition of SW.

When both the NMOS and PMOS transistors are turned on, no gate-oxide reliability risk is present in this example, since substantially all voltage build-up is across the 68 kΩ resistor 203 of FIG. 8A. Thus, relatively small voltage build-up is across the switch.

When both the NMOS and PMOS transistors are turned off, a gate-oxide reliability risk is present. For example, PMOS gate voltage (VG)<source voltage (VS) and NMOS VG<VS. Additionally, NMOS VG=0, VD=3.6V (drain side can handle up to about 5.5V). PMOS worst case is VG=0 to −1.6V, VS=2.9V (VG can be <0V to about −1.6V).

Thus, for the case in which both the NMOS and PMOS transistors are turned off, the $V_{GS}$ of the PMOS transistor can be in the range of about 2.9V to 4.5V, and thus exceed the $V_{GS}$ reliability voltage limitation of 2.8 V. For example, worst case can be about VG=0V to −1.6 V, VS=2.9 V. By including one or more $V_{GS}$ clamps as described above with respect to FIGS. 2 and 9A-10, reliable operating conditions of the switch transistor can be achieved across different switch bias conditions. For instance, in this example, one or more $V_{GS}$ clamps can be used to maintain gate potential to be less than about 2.5 V.

With continuing reference to FIG. 12A, when the PMOS transistor is turned off and the NMOS transistor is turned on, no gate-oxide reliability risk is present. For example, PMOS VG>VS and NMOS VG>VS. Additionally, $V_{GS}$ of the PMOS transistor does not exceed 3.6 V, and PMOS gate is brought up to turn it off. Furthermore, the NMOS transistor is turned on with negligible voltage build-up.

When the PMOS transistor and the NMOS transistor are both off, no gate-oxide reliability risk is present. For example, PMOS VG>VS and NMOS VG<VS. Additionally, $V_{GS}$ of the PMOS transistor does not exceed 3.6 V, and PMOS gate is brought up to turn it off. Furthermore, the NMOS transistor is off and has negligible voltage build-up, since PMOS transistor is off and VD of the NMOS transistor is relatively close to 0 V.

FIG. 12B is a schematic diagram of another example of bias conditions of a switch. The example is illustrated for a −5V negative bias condition.

When the NMOS transistor and the PMOS transistor are both turned on, no gate-oxide reliability risk is present, since substantially all voltage build-up is across the 68 kΩ resistor 203 of FIG. 8A. Thus, relatively small voltage build-up is across the switch.

When the PMOS transistor is turned on and the NMOS transistor is turned off, no gate-oxide reliability risk is present. For example, PMOS VG<VS and NMOS VG<VS. Additionally, for the NMOS transistor, VG=0 and VD=−4.2V (drain side can handle up to about 5.5V). Furthermore, for the PMOS transistor, if VS=−4.2V VG~−5V. Thus, $V_{GS}$ is relatively small and $V_{GD}$ is <5.5V (since this is extended drain device, in this example).

When the PMOS transistor is turned off and the NMOS transistor is turned on, no gate-oxide reliability risk is present. For example, PMOS VG>VS and NMOS VG>VS. Additionally, since NMOS is turned on, VS of the PMOS transistor will be close to 0V and $V_{GS}$ of the PMOS transistor will be small. Furthermore, voltage build-up on PMOS drain side can handle about 5.5 V, since this is an extended drain device.

When the PMOS transistor is turned off and the NMOS transistor is turned off, a reliability risk is present under this bias condition. For example, PMOS VG>VS and NMOS VG<VS. Additionally, for the NMOS transistor, NMOS VG=0 to −1.6V VD=−4.2V (drain side can handle to 5.5V). For the PMOS transistor, at worst case, VG is about 0V, VS is about −4.2V, which exceeds $V_{GS}$ constraints. With respect to $V_{GD}$, VG=0V and VD=−4.2V, which is within $V_{GD}$ constraints.

By including one or more $V_{GS}$ clamps as described above, reliable operating conditions of the switch transistor can be achieved across different switch bias conditions.

Although various examples of simulation parameters and performance results have been provided, simulation or measurement results can vary based on a wide variety of factors, such as simulation models, simulation tools, simulation parameters, measurement conditions, fabrication technology, and/or implementation details. Accordingly, other results are possible.

Figure 13:
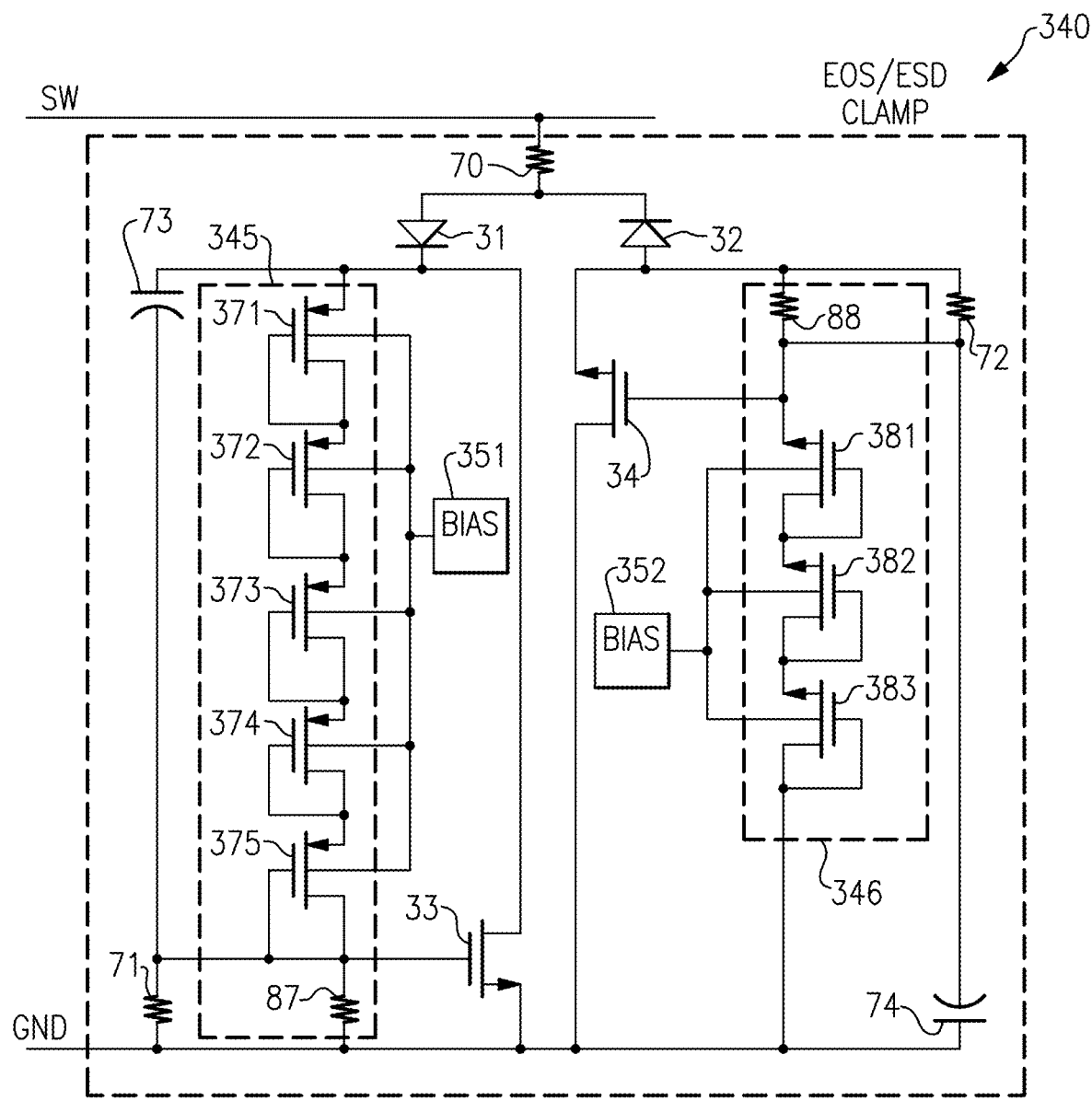
FIG. 13 is a schematic diagram of another embodiment of a clamp for a fault tolerant switch.

FIG. 13 is a schematic diagram of another embodiment of a clamp 340 for a fault tolerant switch. The clamp 340 includes a blocking resistor 70, a first diode 31, a second diode 32, a first clamp NMOS transistor 33, a second clamp NMOS transistor 34, a first trigger resistor 71, a first trigger capacitor 73, a second trigger resistor 72, a second trigger capacitor 74, a first gate bias circuit 345, a second gate bias circuit 346, a first body bias circuit 351, and a second body bias circuit 352.

The clamp 340 of FIG. 13 is similar to the clamp 44 of FIG. 6, except that the clamp 340 further includes the first body bias circuit 351 for biasing the bodies of the diode-connected transistors of the first gate bias circuit 345, and the second body bias circuit 352 for biasing the bodies of the diode-connected transistors of the second gate bias circuit 346.

For example, the first gate bias circuit 345 includes diode-connected transistors 371-375 (five, in this example) and a resistor 87 in series, with the bodies of each of the diode-connected transistors 371-375 biased by the first body bias circuit 351. Although five transistors are shown, more or fewer transistors can be included in series. Additionally, the second gate bias circuit 346 includes diode-connected transistors 381-383 (three, in this example) and a resistor 88 in series, with the bodies of each of the diode-connected transistors 381-383 biased by the second body bias circuit 352. Although three transistors are shown, more or fewer transistors can be included in series.

The first body bias circuit 351 and the second body bias circuit 352 operate to bias the bodies of the diode-connected transistors to reduce leakage. For example, biasing the diode-connected transistors in this manner can aid in reducing transistor leakage relative to an implementation in which each transistor has a body connected to the transistor's source or implementation in which each transistor has a body connected to a power supply voltage.

Although an example with body bias circuits for reducing leakage is shown, other implementations are possible. For instance, in another example, the bodies of the diode-connected transistors 371-375 are connected to the cathode of the first diode 31.

Figure 14:
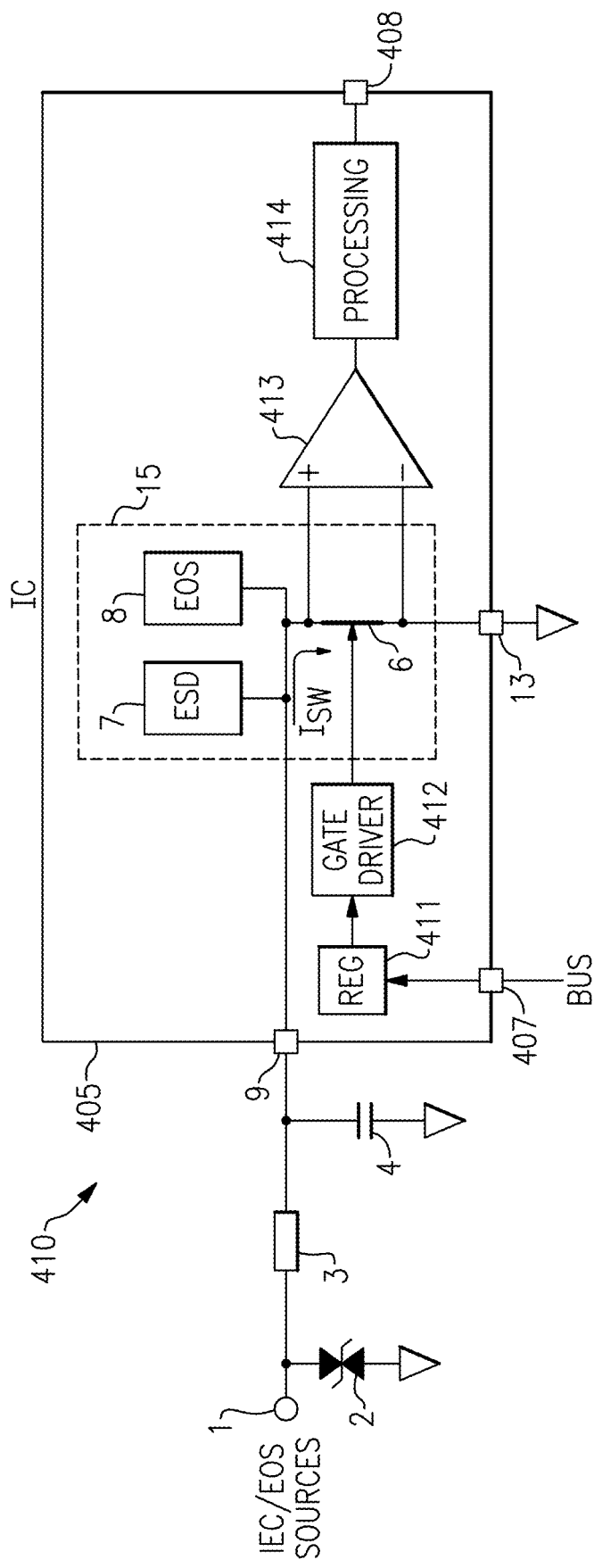
FIG. 14 is a schematic diagram of another embodiment of an electronic system including a fault tolerant switch.

FIG. 14 is a schematic diagram of another embodiment of an electronic system 410 including a fault tolerant switch. The electronic system 410 includes a system pin 1, a TVS diode 2, a resistor 3, a capacitor 4, and a semiconductor die 405.

The electronic system 410 of FIG. 14 is similar to the electronic system 10 of FIG. 1, except that the electronic system 410 includes a different implementation of a semiconductor die. In particular, the semiconductor die 405 of FIG. 14 includes not only the signal pad 9, the ground pad 13, and the fault tolerant switch 15, but also a bus pad 407, a register 411, a gate driver 412, an amplifier 413, a processing circuit 414, and a data output pad 408.

The register 411 receives data from the bus pad 407, which is connected to a serial interface or bus. The data stored in the register 411 is used to control the gate driver 412, which in turn controls the switch component 6 of the fault tolerant switch 412.

The amplifier 413 is used to amplify the voltage across the switch component 6 when the switch component 6 is closed to receive a signal current ($I_{SW}$). The output of the amplifier 413 is processed by the processing circuit 414 to generate data on the data output pad 408.

Applications

Devices employing the above described schemes can be implemented into various electronic devices. Examples of electronic devices include, but are not limited to, consumer electronic products, electronic test equipment, communication infrastructure, medical devices, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die with fault tolerant switching, the semiconductor die comprising:
    a first pad and a second pad;
    a switch including a switch p-type field effect transistor (PFET) and a switch n-type field effect transistor (NFET) electrically connected in series between the first pad and the second pad in a first voltage domain;
    a gate driver configured to control a gate voltage of the switch PFET and a gate voltage of the switch NFET, wherein the gate driver is in a second voltage domain; and
    a clamp electrically connected in parallel with the switch, the clamp including a forward protection circuit including:

a first diode and a first clamp FET in series between the first pad and the second pad, and
a first gate bias circuit configured to bias a gate of the first clamp FET.

2. The semiconductor die of claim 1, wherein the clamp further comprises a reverse protection circuit including a second diode and a second clamp FET in series between the first pad and the second pad, and a second gate bias circuit configured to bias a gate of the second clamp FET, wherein an anode of the first diode and a cathode of the second diode are electrically connected to a common node.

3. The semiconductor die of claim 2, wherein the switch and the clamp are electrically connected in parallel between a switch node and a ground node, the clamp further comprising a blocking resistor electrically connected between the switch node and the common node.

4. The semiconductor die of claim 1, further comprising a gate-to-source clamp electrically connected between a gate of the switch PFET and a source of the switch PFET.

5. The semiconductor die of claim 4, wherein the gate-to-source clamp comprises a plurality of diodes electrically connected in series.

6. The semiconductor die of claim 1, further comprising a gate-to-source clamp electrically connected between a gate of the switch NFET and a source of the switch NFET.

7. The semiconductor die of claim 1, wherein the gate driver comprises a blocking diode and a driver PFET electrically connected in series between a positive supply voltage and the gate of the switch PFET.

8. The semiconductor die of claim 1, wherein the switch PFET, the switch NFET, and the first clamp FET are metal oxide semiconductor (MOS) transistors.

9. The semiconductor die of claim 1, wherein the first gate bias circuit comprises a plurality of diodes electrically connected in series.

10. The semiconductor die of claim 9, wherein the plurality of diodes comprise a plurality of diode-connected transistors, the first gate bias circuit further comprising a body bias circuit configured to bias a plurality of bodies of the diode-connected transistors to control leakage current.

11. The semiconductor die of claim 1, wherein the clamp further comprises a trigger resistor electrically connected between a source of the first clamp FET and the gate of the first clamp FET, and a trigger capacitor electrically connected between the gate of the first clamp FET and a drain of the first clamp FET.

12. The semiconductor die of claim 1, further comprising an amplifier configured to amplify a voltage difference across the switch.

13. The semiconductor die of claim 1, further comprising a register configured to generate an input control signal to the gate driver based on data received over a bus.

14. A semiconductor die with fault tolerant switching, the semiconductor die comprising:
a first pad and a second pad;
a switch including a switch p-type field effect transistor (PFET) and a switch n-type field effect transistor (NFET) electrically connected in series between the first pad and the second pad;
a gate driver configured to control a gate voltage of the switch PFET and a gate voltage of the switch NFET; and
a clamp electrically connected in parallel with the switch, the clamp including a forward protection circuit including:
a first diode and a first clamp FET in series between the first pad and the second pad, and
a first gate bias circuit configured to bias a gate of the first clamp FET; and
a gate clamp electrically connected between a gate of the switch PFET and a negative supply voltage.

15. The semiconductor die of claim 14, wherein the clamp further comprises a reverse protection circuit including a second diode and a second clamp FET in series between the first pad and the second pad, and means for biasing a gate of the second clamp FET.

16. The semiconductor die of claim 14, wherein the first gate bias circuit comprises:
a plurality of diode-connected transistors; and
a body bias circuit configured to bias a plurality of bodies of the diode-connected transistors to control leakage current.

17. A method of fault tolerant switching in a semiconductor die, the method comprising:
controlling a switch using a gate driver, including biasing a switch p-type field effect transistor (PFET) and a switch n-type field effect transistor (NFET) that are in series;
protecting the switch from overvoltage using a clamp that is in parallel with the switch between a first pad and a second pad, including conducting a forward current through a first diode and a first clamp FET in response to an overstress event between the first pad and the second pad;
biasing a gate of the first clamp FET using a first gate bias circuit; and
powering the gate driver with a voltage that is independent from voltages on the first pad and the second pad.

18. The method of claim 17, further comprising conducting a reverse current through a second diode and a second clamp FET in response to an overstress event between the second pad and the first pad, and biasing a gate of the second clamp FET using a second gate bias circuit.

19. The method of claim 17, further comprising amplifying a voltage difference across the switch to sense a signal current flowing through the switch.

20. The method of claim 17, further comprising receiving data over a bus, and controlling the gate driver based on the data.

* * * * *